United States Patent
Cooney, III et al.

(10) Patent No.: US 7,517,802 B2
(45) Date of Patent: *Apr. 14, 2009

(54) METHOD FOR REDUCING FOREIGN MATERIAL CONCENTRATIONS IN ETCH CHAMBERS

(75) Inventors: Edward Crandal Cooney, III, Jericho, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/550,190

(22) Filed: Oct. 17, 2006

(65) Prior Publication Data

US 2007/0066067 A1    Mar. 22, 2007

Related U.S. Application Data

(63) Continuation of application No. 10/604,367, filed on Jul. 15, 2003, now Pat. No. 7,192,874.

(51) Int. Cl.
*H01L 21/302* (2006.01)

(52) U.S. Cl. .................. 438/706; 438/710; 438/714; 134/1.1

(58) Field of Classification Search .................. 438/706, 438/710, 712, 714, 720; 134/1.1, 1.2, 2
See application file for complete search history.

(56) References Cited

U.S. PATENT DOCUMENTS

| | | | |
|---|---|---|---|
| 5,017,835 | A | 5/1991 | Oechsner |
| 5,240,555 | A | 8/1993 | Kilburn |
| 5,417,826 | A | 5/1995 | Blalock |
| 6,020,035 | A | 2/2000 | Gupta et al. |
| 6,035,868 | A | 3/2000 | Kennedy et al. |
| 6,776,851 | B1 | 8/2004 | Singh et al. |
| 6,777,045 | B2 | 8/2004 | Lin |
| 6,814,814 | B2 | 11/2004 | Collins et al. |

FOREIGN PATENT DOCUMENTS

| | | |
|---|---|---|
| JP | 8311665 | 11/1996 |
| JP | 2000199065 | 7/2000 |

*Primary Examiner*—Lan Vinh
(74) *Attorney, Agent, or Firm*—Anthony J. Canale

(57) ABSTRACT

A method of reducing foreign material concentrations in an etch chamber having inner chamber walls is described. The method includes the step of etching a work piece in the etch chamber such that reaction products from the work piece having one or more elements form a first layer of reaction products that partially adhere to the inner chamber walls. A species is introduced into the etch chamber that increases the adhesion of the first layer of reaction products to the inner chamber walls.

8 Claims, 3 Drawing Sheets

_US 7,517,802 B2_

METHOD FOR REDUCING FOREIGN MATERIAL CONCENTRATIONS IN ETCH CHAMBERS

CROSS-REFERENCE TO RELATED APPLICATIONS

This application is a continuation of U.S. application Ser. No. 10/604,367, filed on Jul. 15, 2003, now U.S. Pat. No. 7,192,874, the contents of which are incorporated by reference in its entirety herein.

FIELD OF THE INVENTION

The field of the invention is semiconductor processing. More specifically, the invention relates to reducing foreign material concentrations in a semiconductor process.

BACKGROUND OF THE INVENTION

In the fabrication of a semiconductor device, using conductive lines or interconnects having low resistance to electrical flow for transmitting electrical signals to and from the semiconductor device increases the speed of the semiconductor device. In order to achieve low resistance values for the interconnects, highly conductive metals such as aluminum or copper are used. The interconnects are surrounded by a dielectric material, such as silicon oxide, in order to provide electrical isolation between the interconnects. In one process technique known as the damascene process, the silicon oxide dielectric layer is formed and is then patterned using known photolithography and etch techniques to provide trenches or holes in the silicon oxide dielectric. A plasma clean using an inert gas such as an argon sputter clean is performed to clean the underlying surface exposed by a trench or hole, such as an underlying metal interconnect or a via surface. The interconnect metal is deposited into the trench or hole and planarized to a top surface of the silicon oxide dielectric. The plasma clean provides for a clean underlying surface that reduces electrical contact resistance between the deposited interconnect metal and the underlying surface further improving the speed performance of the semiconductor device.

Since the dielectric layer is at least partially exposed during the plasma clean process, reaction products of the dielectric layer form on exposed surfaces of the plasma clean reaction chamber, such as chamber walls and portions of the substrate holder. A plasma clean reaction chamber such as, for example, a sputter etch chamber, includes a base having a substrate holder for holding a substrate during processing and a quartz dome which encloses the substrate holder and forms the process volume for the plasma clean reaction to occur. For a substrate having a silicon oxide dielectric layer exposed to an argon sputter clean, silicon oxide reaction products such as Si and SiOx are formed on the exposed surfaces of the sputter etch chamber. It has been found that for semiconductor substrates in a 0.13 um technology, the silicon oxide reaction products adhere to the exposed surfaces of the sputter etch chamber with sufficient strength such that an average of about 2000 semiconductor substrates can be processed prior to significant portions of the silicon oxide reaction products detaching from the sputter etch chamber walls and exposed surfaces resulting in foreign material contamination of subsequently processed semiconductor substrates. Processing of the semiconductor substrates in the sputter etch chamber is stopped and the sputter etch chamber is removed from production for chamber cleaning. Chamber cleaning includes venting the sputter etch chamber to atmospheric pressure and removing the quartz dome. Silicon oxide reaction products adhering to the quartz dome and exposed surfaces of the sputter etch chamber are removed by physical and chemical techniques such as bead blasting the inner surface of the quartz dome followed by a water rinse and wiping with isopropyl alcohol (IPA). After the components of the sputter etch chamber have been cleaned, the chamber is re-assembled, pumped down to vacuum, conditioned and returned to production.

The increasing demands of semiconductor applications has resulted in the need for further improvement in the speed and size of semiconductor devices. The dielectric layer used to electrically insulate metal interconnects introduces a parasitic dielectric capacitance into the semiconductor device. As the distance between metal interconnects decreases as semiconductor devices become smaller, the parasitic dielectric capacitance increases resulting in a degradation of the speed of semiconductor devices. Silicon oxide has been used as the dielectric layer due to its relatively easy integration into existing semiconductor processing technology. However, as semiconductor devices continue to decrease in size, the increasing parasitic dielectric capacitance introduced by a silicon oxide dielectric layer becomes a significant factor in reducing the speed of semiconductor devices.

The insulating properties of a dielectric material can be characterized by a relative value, known as the "K" value of the dielectric material. For example, air is a high electrically insulating dielectric and is assigned a "K" value of 1.0. By comparison, silicon oxide is less electrically insulating than air and has a higher "K" value of approximately 4.5. A high "K" value is an indication of a relatively lower electrical insulating property of a dielectric material. As the requirements for semiconductor devices demand decreases in size and increases in speed, dielectric materials having a "K" value less than silicon oxide are desired in order to reduce the parasitic dielectric capacitance. Dielectric materials such as "Silicon Low-K" (hereinafter referred to as SiLK) available from Dow Chemical Co., "Black Diamond" available from Applied Materials Inc. or "Coral" available from Novellus Corp., have "K" values ranging from about 3.5 to about 2.0 or lower which make them candidates to replace silicon oxide as a dielectric layer in semiconductor devices. "Low K" dielectric materials such as SiLK are formed of polymers and contain carbon. SiLK can be used to replace silicon oxide as the interconnect dielectric layer in semiconductor devices resulting in a reduction of the parasitic dielectric capacitance.

SUMMARY OF THE INVENTION

During the plasma clean of the underlying surface exposed by the trench or hole in the SiLK layer, portions of the SiLK layer are exposed to the plasma clean resulting in carbon-containing reaction products forming on exposed surfaces of the plasma clean reaction chamber, such as chamber walls and portions of the substrate holder. These reaction products contaminate the process chamber which requires the system to be shut down. In contrast to the process chamber lifetimes of about 2000 semiconductor substrates achieved with silicon oxide interconnect dielectric layers, it has been found that for SiLK-containing semiconductor substrates in a 0.13 um technology, the carbon-containing reaction products have a poor adhesion to the exposed surfaces of the sputter etch chamber such that an average of only about 200 semiconductor substrates can be processed prior to significant portions of the carbon-containing reaction products detaching from the sputter etch chamber walls and exposed surfaces resulting in foreign material contamination of subsequently processed semiconductor substrates. Processing of SiLK-containing semiconductor substrates in the sputter etch chamber is stopped and the sputter etch chamber is removed from production for chamber cleaning. Chamber cleaning includes venting the sputter etch chamber to atmospheric pressure and removing the quartz dome. Carbon-containing reaction products adhering to the quartz dome and exposed surfaces of the sputter etch chamber are removed by physical and chemical techniques such as bead blasting the inner surface of the quartz dome followed by a water rinse and wiping with isopropyl alcohol (IPA). After the components of the sputter etch chamber have been cleaned, the chamber is re-assembled, pumped down to vacuum, conditioned and returned to production.

The use of carbon-containing "low K" dielectric materials in semiconductor devices results in a significant decrease in the production availability of sputter etch chambers.

The reduced chamber availability results in increased production costs associated with processing "low K" semiconductor substrates mainly due to reduced production time, increased spare parts costs and decreased product yield due to foreign material contamination.

Therefore, an object of the invention is to reduce foreign material concentrations in a reaction chamber by increasing the adhesion of carbon-containing reaction products to exposed inner surfaces of the reaction chamber.

It is another object of the present invention to reduce production cost by increasing the production availability time of the reaction chamber.

The foregoing and other objects of the invention are realized, in a first aspect, by a method of reducing foreign material concentrations in an etch chamber having inner chamber walls, comprising the steps of:
 a) etching a work piece in the etch chamber, the work piece having one or more elements that form a first layer of reaction products during said etch step that partially adhere to said inner chamber walls; and,
 b) introducing a species into said etch chamber that increases the adhesion of said first layer of reaction products to said inner chamber walls.

DESCRIPTION OF THE DRAWING

The foregoing and other features of the invention will become more apparent upon review of the detailed description of the invention as rendered below. In the description to follow, reference will be made to the several figures of the accompanying Drawing, in which.

DETAILED DESCRIPTION OF THE PREFERRED EMBODIMENTS OF THE INVENTION

Figure 1A:
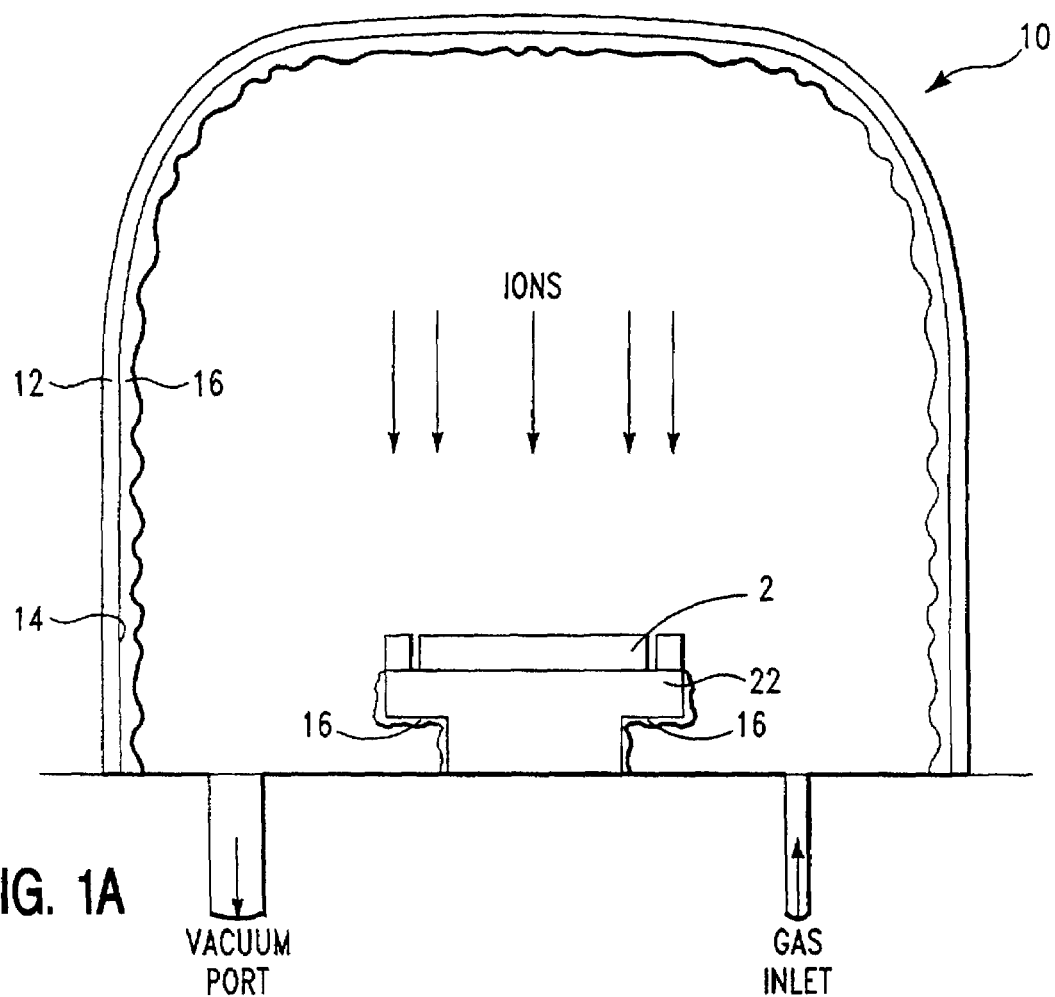
FIG. 1A is a cross sectional view of an etch chamber showing formation of a carbon-containing layer on exposed surfaces according to the present invention.
Figure 1B:
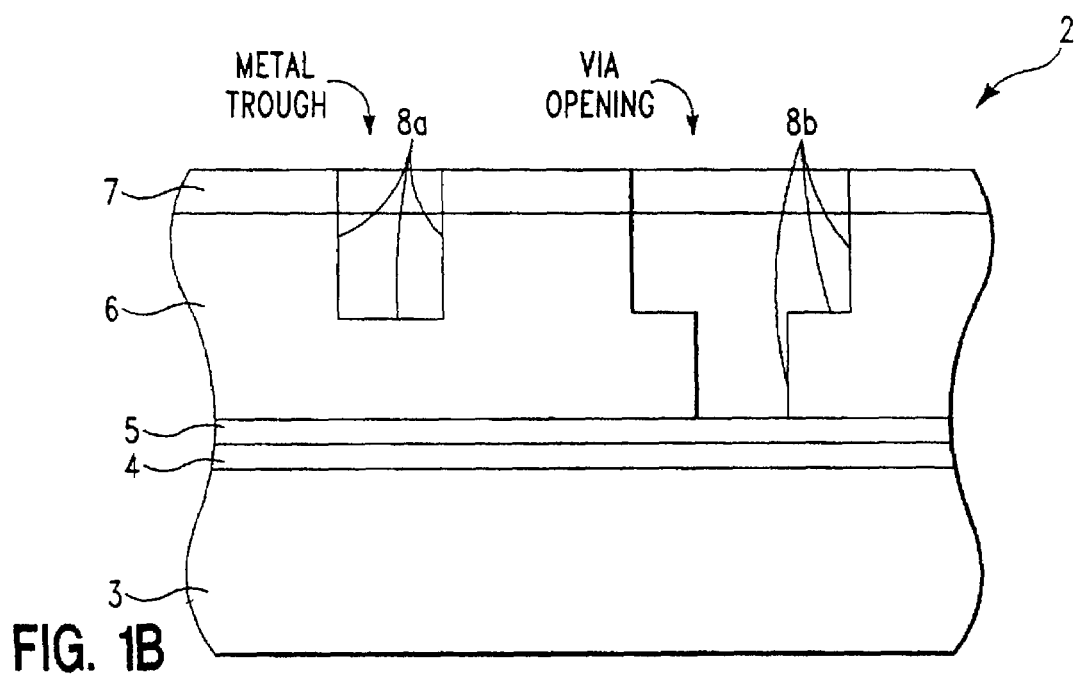
FIG. 1B is a cross sectional view of a work piece according to the present invention.

Attention is now directed to FIG. 1A which illustrates a reaction chamber 10 where removal of thin films or cleaning by etching or sputtering a surface of work piece 2 can occur. An Applied Materials "Endura" sputter etch chamber is an example of reaction chamber 10 that can be used in the present invention where chamber wall 12 is a quartz dome having an inner surface 14. Work piece 2 is placed on substrate holder 22 during processing. As shown in FIG. 1B, work piece 2 comprises semiconductor substrate 3 such as silicon, Silicon-On-Insulator (SOI) or glass; layer 4 comprising semiconductor devices, dielectrics and interconnects; layer 5 comprising a dielectric material such as silicon nitride; carbon-containing interconnect dielectric 6 such as "SiLK" available from Dow Chemical Co., "Black Diamond" available from Applied Materials Inc., or "Coral" available from Novellus Corp.; and, layer 7 comprising an insulating material such as silicon nitride or silicon carbide (SiC). FIG. 1B shows work piece 2 including a metal trough or a via opening used in damascene wiring which exposes portions 8a and 8b of carbon-containing interconnect dielectric 6 to a sputter etch clean process. A sputter etch clean process used in the present invention comprises ionizing an inert gas such as argon (Ar), helium (He) or nitrogen (N2), or a noble gas such as neon (Ne), Krypton (Kr) or Xenon (Xe), to provide ions to directionally bombard work piece 2. A preferred inert gas is Ar and an Ar sputter etch clean provides a clean underlying metal or via surface prior to depositing the liner and seed layers used in damascene wiring. For example, using an Applied Materials Endura sputter etch chamber, an Ar sputter etch clean using processing conditions such as a chamber pressure of about 5 millitorr, RF plasma power of about 300 watts, RF wafer bias power of about 100 watts, argon gas flow from about 20 sccm to about 50 sccm, and a time duration from about 5 to about 35 seconds is applied to work piece 2. Since portions 8a and 8b are exposed to the Ar sputter etch clean, Ar ions impinge on portions 8a and 8b resulting in reaction products ejecting from SiLK layer 6 to form layer of carbon-containing reaction products 16 (hereinafter referred to as "layer 16") on internal components of chamber 10 such as inner surface 14 and exposed portions of substrate holder 22 as shown in FIG. 1A.

It has been discovered that when SiLK-containing substrates are processed in chamber 10, portions of layer 16 do not adhere adequately to inner surface 14 and detach from inner surface 14 resulting in relatively large particulates of foreign material. It has been determined through Scanning Electron Microscopy (SEM) analysis of substrates on which foreign material particulates from portions of layer 16 have fallen onto, that the particulates of foreign material are from about 0.5 um to about 500 um in size. The foreign material particulates caused by the detaching of portions of layer 16 from inner surface 14 are large enough to cause a degradation in product yield when the particulates fall on substrates being processed in sputter etch chamber 10. For a 0.13 um technology, a foreign material particulate of about 0.5 um in size is large enough to interfere with subsequent processing steps resulting in a defective semiconductor chip. Therefore, in order to minimize the amount of product yield loss due to foreign material particulates caused by detaching portions of layer 16, the number of SiLK-containing substrates that are processed in chamber 10 is limited to the period of time when layer 16 is substantially adhering to inner surface 14 such that the exposure of the SiLK-containing substrates to large particulates of foreign material that can impact product yield is minimized. A tool such as, for example, a Tencor 6200 Surface Scan can be used to measure the number of foreign material particulates having a size greater than 0.16 um that are added to a bare silicon wafer that is exposed to chamber 10. When a limit of greater than about 40 foreign material particulates is exceeded, processing of SiLK-containing substrates is stopped. For example, it has been found that only about 20 to about 500 SiLK-containing substrates, typically about 200 substrates, can be Ar sputter cleaned before the limit of 40 foreign material particulates is exceeded resulting in having to stop processing and performing a chamber cleaning. On the other hand, for substrates having a silicon oxide interconnect dielectric, about 2000 substrates can be Ar sputter cleaned in chamber 10 prior to the limit of 40 foreign material particulates being exceeded. Thus, the available production time of chamber 10 is reduced by about a factor of 10 by the processing of SiLK-containing substrates compared to silicon oxide-containing substrates.

In order to reduce foreign material concentrations so that the available cycle time between cleaning and taking off-line of chamber 10 for SiLK-containing substrates is made equivalent to that of silicon oxide-containing substrates, it has been found that the occurrence of foreign material particulates can be significantly reduced during processing of SiLK-containing substrates by increasing the adhesion of layer 16 to exposed portions of chamber 10 such as inner surface 14.

Figure 2A:
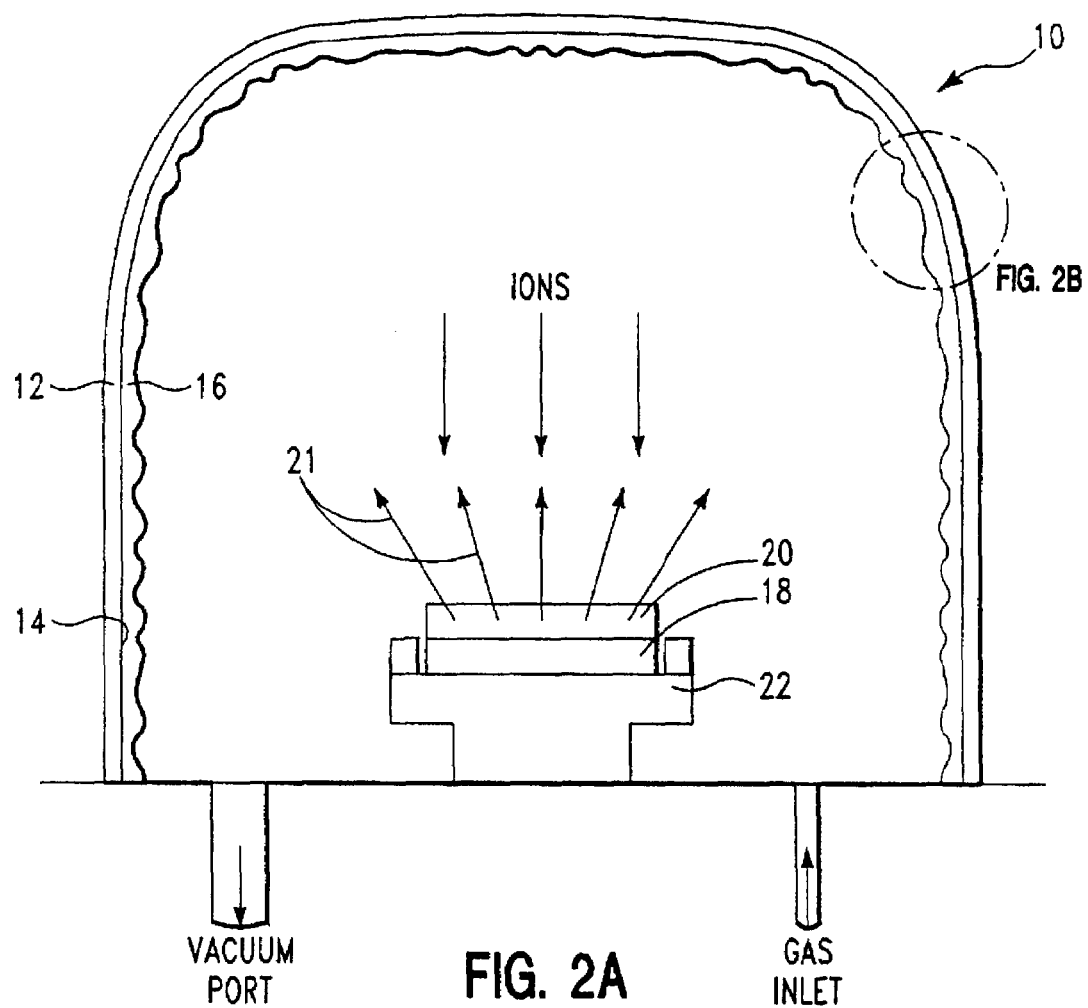
FIG. 2A is a cross sectional view of an etch chamber according to the present invention.

According to a first embodiment of the present invention as shown in FIG. 2A, substrate 18 having film 20 thereupon is introduced into chamber 10 on substrate holder 22 after removal of work piece 2 from chamber 10. Substrate 18 can include a semiconductor substrate such as a silicon wafer, Silicon-on-Oxide (SOI) wafer, GaAs wafer or other substrates upon which a thin film can be formed. Film 20 comprises a material which can be etched in chamber 10 to provide species 21. Film 20 can be formed from a material such as silicon oxide or alumina. For example, a thickness in the range of about 50 nm to about 1000 nm of silicon oxide can be deposited on silicon substrate 18 by a known method such as Chemical Vapor Deposition (CVD) to form silicon oxide film 20. Accordingly, an Ar sputter etch process in accordance with the present invention comprises processing conditions such as, for example, a chamber pressure of about 5 millitorr, RF plasma power of about 300 watts, RF wafer bias power of about 100 watts, argon gas flow from about 20 sccm to about 50 sccm, and a time duration from about 5 to about 35 seconds. The sputter etching of silicon oxide film 20 results in the release of species 21 including reaction products such as Si, O2 or SiOx. Species 21 form on inner surface 14 to form coating layer 24 over layer 16.

Figure 2B:
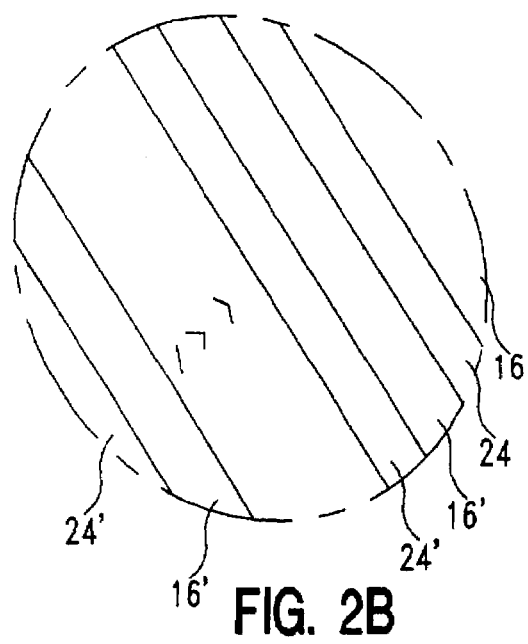
FIG. 2B is a cross sectional view of layers formed on exposed surfaces of the etch chamber according to the present invention.

When it was first observed that portions of layer 16 were detaching from inner surface 14 and resulting in relatively large particulates of foreign material, a portion of chamber wall 12 was cross-sectioned and inner surface 14 was analyzed by SEM. It has been determined by this analysis of portions of chamber wall 12 that during processing of a run of about 20 to about 30, typically about 25, SiLK-containing substrates for a 0.13 um generation technology, about 20 nm to about 30 nm of layer 16 is formed on inner surface 14. In order to increase adhesion of layer 16 to inner surface 14, the process of forming coating layer 24 is performed after each run of about 25 SiLK-containing substrates. After processing of about 25 SiLK-containing substrates, substrate 18 is placed in chamber 10 and Ar sputter etched to remove from about 200 nm to about 400 nm, typically about 300 nm, of thickness from silicon oxide film 20 to provide about 50 nm or more of coating layer 24 on top of layer 16. Substrate 18 is then removed from sputter etch chamber 10 and processing of another run of about 25 SiLK-containing substrates occurs. Each subsequent run of about 20 to about 30 SiLK-containing substrates and corresponding coating process produces an alternating layer of carbon-containing reaction products 16' and coating layer 24' as shown in FIG. 2B. Each coating layer 24' covers a respective underlying layer 16' to prevent portions of the underlying layer 16' from detaching and creating foreign material particulates.

By performing the coating process described above, sputter etch chambers that process work pieces having a SiLK interconnect dielectric can achieve significant reductions in foreign material concentrations such that about 2000 SiLK-containing substrates can be processed in chamber 10 prior to foreign material becoming a factor to stop processing, thereby achieving an available production time equivalent to that of silicon oxide-containing work pieces. It has been determined that since silicon oxide coating layer 24 and quartz chamber wall 12 are of a similar material, there is a strong bond between coating layer 24 and inner surface 14. Layer 16 may be porous or discontinuous which allows coating layer 24 to form areas of strong adhesion to an exposed underlying inner surface 14 or coating layer 24'. Thus, coating layers 24, 24' effectively increase the adhesion of layers 16, 16' to inner surface 14, thereby significantly reducing premature foreign material generation.

Figure 3A:
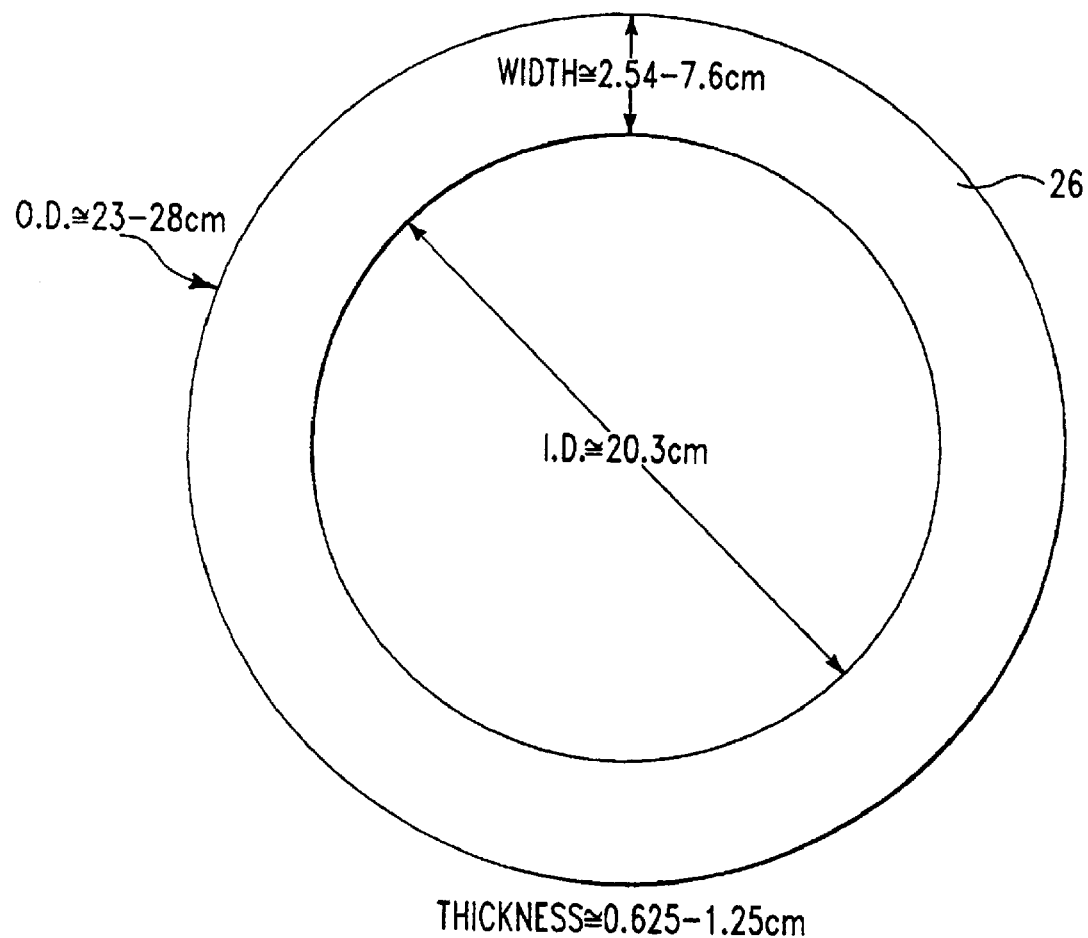
FIGS. 3A, B show an internal component of a sputter etch chamber according to a second embodiment of the present invention.
Figure 3B:
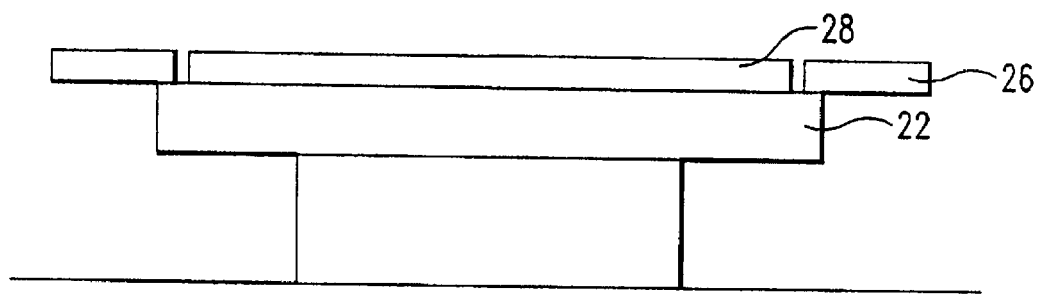

In a second embodiment of the present invention, an internal component of sputter etch chamber 10 can be used to provide species 21 which forms coating layer 24. As shown in FIGS. 3A and 3B, ring 26 is provided surrounding work piece 28 and extending beyond an edge of substrate holder 22. For work piece 28 having an outer diameter of about 20 cm (i.e. an eight inch semiconductor wafer), ring 26 can have an inner diameter of about 20.3 cm, an outer diameter of about 23 to about 28 cm and a thickness of about 0.625 to about 1.25 cm. Ring 26 can be fabricated from a material, such as quartz or aluminum-oxide, to provide Si, O, SiOx species during a sputter etch process. The use of ring 26 during the processing of a SiLK-containing work piece 28 allows for species 21 to be provided to form coating layer 24 simultaneously during processing of SiLK-containing work piece 28. Since carbon-containing reaction product from the processing of SiLK-containing work piece 28 and species 21 form simultaneously on inner surface 14, layer of carbon-containing reaction products 16 and coating layer 24 form a mixed layer having a strong adhesion to inner surface 14. Ring 26 eliminates the requirement for inserting a substrate having a silicon oxide film at a fixed periodicity as described in the first embodiment. However, ring 26 can also be used in conjunction with substrate 18 having silicon oxide film 20 as described in the first embodiment in order to provide an additional source of species 21 to form coating layer 24.

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto.

What is claimed is:

1. A method of reducing foreign material concentrations in a reaction chamber having inner chamber walls, comprising:
    a) etching a work piece in the reaction chamber, the work piece having one or more elements that form a first layer of reaction products during said etch step that partially adhere to said inner chamber walls; and,
    b) introducing a species comprising silicon and oxygen into said reaction chamber that increases the adhesion of said first layer of reaction products to said inner chamber walls, wherein said silicon and oxygen are provided by a substrate or a component of said reaction chamber.

2. The method of claim 1, wherein in said introducing step (b) a second layer is formed on said first layer.

3. The method of claim 1, wherein said reaction chamber comprises a vacuum chamber.

4. The method of claim 3, wherein said vacuum chamber comprises a sputter etch chamber.

5. The method of claim 1, wherein said inner chamber walls comprise quartz.

6. The method of claim 1, wherein said work piece comprises a semiconductor, glass, ceramic or aluminum oxide.

7. The method of claim 1, wherein said work piece comprises a carbon-containing layer.

8. The method of claim 7, wherein said carbon-containing layer comprises a low-K dielectric, polyimide, or photoresist.

* * * * *